May 3, 1966 E. DE NIET 3,249,881
STABILIZED PARAMETRIC AMPLIFIER WITH PUMP NEGATIVE FEEDBACK
Filed July 13, 1964
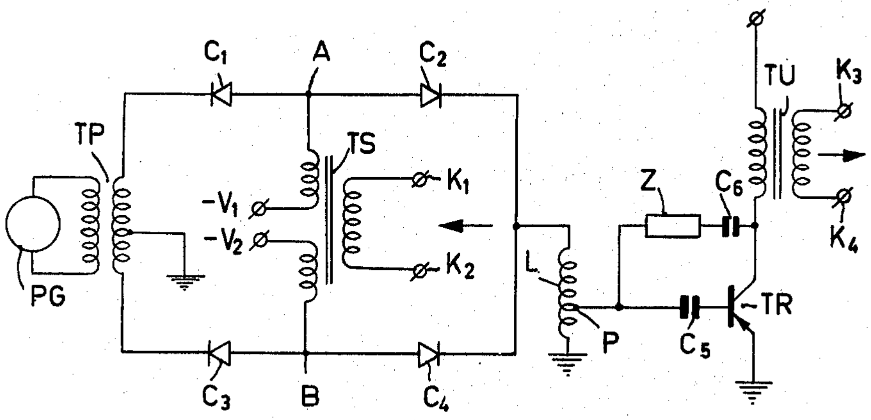
INVENTOR.
EDMOND DE NIET
BY
F. L. Tripp
AGENT United States Patent Office 3,249,881

Patented May 3, 1966

3,249,881

STABILIZED PARAMETRIC AMPLIFIER WITH PUMP NEGATIVE FEEDBACK

Edmond De Niet, Emmasingel, Eindhoven, Netherlands, assignor to North American Philips Company, Inc., New York, N.Y., a corporation of Delaware Filed July 13, 1964, Ser. No. 382,072
Claims priority, application Netherlands, July 24, 1963, 295,754
6 Claims. (Cl. 330—3)

The invention relates to a parametric amplifier.

Parametric amplifiers are known which include a resonant circuit containing at least one capacitance adapted to be varied under the control of the signal to be amplified. In these amplifiers pumping energy having a frequency at least substantially equal to the resonant frequency of the tuned circuit is applied to the tuned circuit.

By variation of the tuning of the circuit the pumping oscillation is amplitude-modulated by the signal oscillation. The signal may be recovered in amplified form after rectification, and, as the case may be, further high-frequency amplification.

Such an arrangement has the particular advantage, that the internal noise of the amplifier is very low and hence a reasonably satisfactory signal-to-noise ratio in obtainable even with weak input signals. The signal may, for example, be an audio-frequency signal, in which case the amplifier is advantageously used for amplifying weak output voltage of a microphone or of the play-back head of a tape recorder. The amplification achieved depends upon several factors, such as the steepness of the control slope of the variable capacitance and the strength of the applied pumping oscillation. The variable capacitance usually is a varactor diode, that is a crystal diode which is prepolarized in the reverse direction and hence passes substantially no direct current. In practice the steepness of the control slope of such a diode cannot be raised indefinitely. Usually amplification may be increased by applying a stronger pumping oscillation. However, this is also restricted within predetermined limits.

Primarily it might be expected that the output voltage is proportional to the product of the signal to be amplified and the applied pumping oscillation and hence that the amplification is proportional to the amplitude of the pumping oscillation. At comparatively small amplitudes of the pumping oscillation this is indeed the case.

It has been found, however, that at greater values of the pumping oscillation the amplification increases at a more than proportional rate with the amplitude while the bandwidth decreases. With further increase in the value of the pumping oscillation the bandwidth assumes an unpractically small value and in addition the amplifier becomes unstable and starts to oscillate spontaneously, the output oscillation depending no longer upon the input signal so that the amplification drops to zero.

Further investigation has shown that in actual fact two effects are significant. Firstly, similarly to a conventional modulator, amplification is effected by the production of an output voltage proportional to the product of signal and pumping oscillation. This "modulation" amplification is proportional to the amplitude of the pumping oscillation.

Secondly the varying capacitance produces an oscillation at a frequency twice that of the pumping oscillation. Through the varying capacitance the said second harmonic is re-mixed with the pumping oscillation so as to produce an oscillation at a frequency equal to that of the pumping oscillation and with a phase such that the damping of the circuit is reduced. Thus the occurrence of the second harmonic has an effect equal to that produced by the introduction into the circuit of a negative resistance.

Summarizing the above we may state that the amplification primarily is due to the modulation effect, while additional amplification is produced by the reduction of the damping of the circuit by the negative-resistance effect. The latter effect sets a limit on the maximum amplification obtainable since an excessive pumping oscillation results in excessive reduction of the bandwidth and a tendency of the amplifier to become unstable. This cannot be compensated for by heavier damping of the circuit because this introduces an additional source of noise into the circuit and adversely affects the signal- to noise-ratio.

According to the invention, this disadvantage is obviated by feeding back energy to the circuit from a succeeding amplifier stage with a phase such that the circiut is damped while the pumping energy supplied to the circuit has a value such that without the said feedback spontaneous oscillation of the amplifier would occur.

By feeding back energy from a succeeding amplifier stage negative feedback is provided by which, as is known, the signal- to noise-ratio is not changed, however, the circuit is damped so that the negative-resistance effect is compensated for and consequently the bandwidth need not assume an inadmissibly low value. Since elimination of the negative-resistance effect enables the pumping energy to be increased, the obtainable amplification also is greater than would otherwise be the case.

In order that the invention may readily be carried into effect, an embodiment thereof will now be described with reference to the accompanying drawing. The single figure of drawing is a circuit diagram of a parametric amplifier in accordance with the invention.

Through a transformer TP a centre tapping on the secondary winding of which is connected to earth, the voltage of the pumping generator PG is applied in phase opposition to the series connection of crystal diodes $C_1$ and $C_2$ and to the series connection of diodes $C_3$ and $C_4$. The other ends of the said series circuits are connected to earth through an inductance L.

The signal to be amplified is applied to terminals $K_1$ and $K_2$ of a transformer TS, so that it appears in phase opposition at the junctions A and B of the diodes $C_1$, $C_2$ and $C_3$, $C_4$ respectively. Each secondary winding of the transformer TS is connected at one end to a point $-V_1$ and $-V_2$ respectively having a negative potential with respect to earth so that all the diodes are prepolarized in the reverse direction and hence pass no direct current. As is known, however, under these circumstances the crystal diodes are capable of passing an alternating current and hence behave as capacitances. The value of the capacitance depends upon the value of the voltage across the diode. In the case under consideration the signal voltage is superposed on the negative bias voltage of the diodes in a manner such that when the value of the capacitances formed by the diodes $C_1$ and $C_2$ is increased under the control of the signal voltage, the value of the capacitance of the diodes $C_3$ and $C_4$ is reduced, and conversely, because the phase of the signal voltage in the point A is opposed to that in the point B.

The frequency of the pumping oscillation supplied by the generator PG may be, say, 3 mc./s. For this frequency the impedance of the transformer TS is so high that it passes substantially no high-frequency current and the capacitances constituted by the diodes $C_1$ and $C_2$ and the diodes $C_3$ and $C_4$ respectively are effectively connected in series. The impedance measured at the secondary terminals of the transformer TP is comparatively low. Consequently the series combinations of the variable capacitances $C_1$, $C_2$ and $C_3$, $C_4$ respectively are substantially connected in parallel with one another and the said parallel combination together with the inductance L forms a resonant circuit having a resonant frequency which is about equal to the pumping frequency.

As has been stated hereinbefore, the pumping generator PG applies a pumping oscillation in phase opposition to the series circuits of the capacitances $C_1$, $C_2$ and $C_3$, $C_4$ respectively by way of the transformer TP. If the overall capacitances in both branches are equal, no high-frequency oscillation will be set up across the inductance L. To obtain some oscillation across the inductance L to act as a carrier, however, the bias voltages $-V_1$ and $-V_2$ for the diodes are made slightly different so that the rest capacitances also are different. If now, under the control of the signal, voltage set up in the points A and B, the capacitances in one branch are slightly increased and in the other branch slightly decreased, for example, the voltage across the inductance will rise while it will fall off with opposite phase of the signal oscillation. Thus an amplitude-modulated signal is produced across the inductance L and may be taken from a tapping P on the inductance L and applied through a capacitor $C_5$ to the base of a transistor TR. The transistor TR further amplifies it so that from the output terminals $K_3$ and $K_4$ of a transformer TU an amplified high-frequency signal may be taken from which after rectification an amplified low-frequency signal may be derived.

As will be appreciated, the amplification will generally increase in the applied pumping oscillation because in this case the currents flowing through the diode branches will also be increased. As previously mentioned it has been found that the amplification increases at a more than proportional rate with the amplitude of the pumping oscillation. This effect is to be ascribed to the occurrence of a strong second harmonic component of the pumping oscillation and a consequent reduction in the damping of the circuit, resulting in a pronounced narrowing of the bandwidth and a likelihood of instability.

According to the invention, in order to obviate the above difficulty the collector of the transistor TR is connected through a coupling capacitor $C_6$ and an impedance Z to the tapping P on the inductance L. When the load of the collector of the transistor TR is resistive, the voltage at the collector is in phase opposition to that at the base, that is the voltage of the point P. When the impedance Z is also resistive, the impedance Z will pass a current which is in phase with the voltage in the point P. In this case the negative feedback results in that the point P is connected to an apparent resistance which damps the circuit and eliminates the negative-resistance effect, so that the pumping oscillation may be much stronger. Although the impedance Z under the said conditions will provide a certain contribution to the noise, this contribution is very small, for owing to the fact that the transistor acts as an amplifier the damping resistance introduced in the point P by the negative feedback has a much lower value than the resistance Z and hence the damping is much greater than if the resistance Z were directly connected between the point P and earth.

The noise is increased to an even smaller extent if the negative feedback is provided in another manner, for example, by omitting the impedance Z between the collector and the emitter of the transistor TR and connecting a small inductance between the emitter and earth and a small capacitance between the emitter and the base. This circuit arrangement also damps the resonant circuit, however, the noise is not increased because the coupling elements are purely reactive.

What I claim is:

1. A parametric amplifier comprising a source of signals to be amplified, a source of pump oscillations, a resonant circuit comprising at least one voltage variable capacitor, said resonant circuit being resonant at substantially the frequency of said pump oscillations, means applying said pump oscillations to said resonant circuit whereby the capacitance of said capacitor is varied at the frequency of said oscillations, means applying said signals to said capacitor to vary the capacitance thereof, and output circuit means coupled to said resonant circuit, said output circuit comprising an amplifying stage for amplifying output oscillations of said pump oscillation frequency coupled from said resonant circuit, and feedback means connected to negatively feed back a portion of the pump frequency output of said amplifying stage to said resonant circuit for damping said resonant circuit.

2. The parametric amplifier of claim 1, wherein said pump oscillations have sufficient amplitude that said amplifier oscillates in the absence of said feedback means.

3. A parametric amplifier comprising a source of signals to be amplified, a source of pump oscillations, a resonant circuit comprising two series-connected voltage variable capacitors and an inductor, said resonant circuit being resonant at substantially the frequency of said oscillations, means applying said pump oscillations serially to said capacitors whereby the capacitance of said capacitors varies, oppositely at said pump frequency, means applying said signals to the junction of said capacitors whereby the capacitance of said capacitors varies in the same phase with respect to said signals, amplifying means connected to said inductor for amplifying oscillations of the frequency of said pump oscillations, and feedback means for negatively feeding back a portion of the pump frequency output of said amplifying means to said resonant circuit for damping said resonant circuit, said pump oscillations having sufficient amplitude that said amplifier oscillates in the absence of said feedback means.

4. The parametric amplifier of claim 3, in which said capacitors are crystal diodes with like electrodes being interconnected, comprising means connected to said junction for biasing said diodes to the nonconducting state.

5. A parametric amplifier comprising a source of signals, a source of pump oscillations, a resonant circuit comprising an inductor, a first series circuit of first and second crystal diodes with like electrodes interconnected, a second series circuit of third and fourth crystal diodes with like electrodes interconnected, and means connecting said first and second series circuits in parallel with said inductor, said resonant circuit being resonant at substantially the frequency of said pump oscillations, means applying said pump oscillations serially to said first and second series circuits, means providing a reverse bias for said diodes, means connected to the junction of said first and second diodes and the junction of said third and fourth diodes for applying said signal to said diodes, amplifying means for amplifying oscillations of the frequency of said pump oscillations and having an input circuit connected to said inductor, and feedback means connected to the output of said amplifying stage for negatively feeding back a portion of the pump frequency output of said amplifying stage to said inductor for damping said resonant circuit, said pump oscillations having sufficient magnitude that said amplifier oscillates in the absence of said feedback means.

6. A parametric amplifier comprising a source of signals, a source of pump oscillations, first, second, third and fourth crystal diodes serially connected in that order with like electrodes interconnected, a transformer having a primary winding and a tapped secondary winding, means applying said oscillations to said primary winding, means connecting said secondary winding between the remaining electrodes of said first and fourth diodes, an inductor connected between the junction of said second and third diodes and the tap of said secondary winding, whereby said inductor and diodes form a parallel circuit resonant at substantially the frequency of said oscillations, means providing reverse bias voltages to the junction of said first and second diodes and the junction of said third and fourth diodes whereby a portion of said oscillations are developed across said inductor, means applying said signals with opposite phase to the junction of said first and second diode and the junction of said third and fourth capacitor, an amplifying stage for amplifying oscillations of the frequency of said pump oscillations and having an input circuit connected to said inductor, and feedback means connected to the output of said amplifying stage for negatively feeding back a portion of the pump frequency output of said amplifying stage for damping said resonant circuit, the amplitude of said pump oscillations being sufficient to cause said resonant circuit to oscillate in the absence of said feedback means.

References Cited by the Examiner

UNITED STATES PATENTS 2,850,585 9/1958 Green ---------------- 330—7

OTHER REFERENCES

Biard: "Proceedings of the IEEE," February 1963, pp. 298–303.

ROY LAKE, *Primary Examiner.*

D. R. HOSTETTER, *Assistant Examiner.*